US012663720B2

(12) United States Patent
Goh et al.

(10) Patent No.: US 12,663,720 B2
(45) Date of Patent: Jun. 23, 2026

(54) APPARATUS FOR SUPPLYING LIQUID AND APPARATUS FOR TREATING SUBSTRATE

(71) Applicants: SEMES CO., LTD., Cheonan-si (KR); SEOUL NATIONAL UNIVERSITY R&DB FOUNDATION, Seoul (KR)

(72) Inventors: Jung Suk Goh, Hwaseong-si (KR); A Rah Cho, Daejeon (KR); Woo Sin Jung, Cheonan-si (KR); Dae Sung Kim, Cheonan-si (KR); Hae Kyung Kim, Cheonan-si (KR); Hyungmin Park, Seoul (KR); Jungjin Lee, Seoul (KR); Linfeng Piao, Incheon (KR); Jubeom Lee, Gimpo-si (KR)

(73) Assignees: Semes Co., Ltd., Chungcheongnam-do (KR); Seoul National University R&DB Foundation, Seoul (KR)

( * ) Notice: Subject to any disclaimer, the term of this patent is extended or adjusted under 35 U.S.C. 154(b) by 772 days.

(21) Appl. No.: 17/940,207

(22) Filed: Sep. 8, 2022

(65) Prior Publication Data

US 2023/0073867 A1 Mar. 9, 2023

(30) Foreign Application Priority Data

Sep. 8, 2021 (KR) ........................ 10-2021-0119980

(51) Int. Cl.
*G03F 7/16* (2006.01)
*B05C 11/10* (2006.01)

(52) U.S. Cl.
CPC .......... *G03F 7/162* (2013.01); *B05C 11/1047* (2013.01)

(58) Field of Classification Search
CPC ........................ G03F 7/162; B05C 11/10–1047
See application file for complete search history.

(56) References Cited

U.S. PATENT DOCUMENTS 4,932,353 A * 6/1990 Kawata ............... B05C 11/1042
118/302
5,462,199 A * 10/1995 Lenhardt ................ B05C 11/10
118/667
6,425,497 B1 * 7/2002 Chu ........................ G03F 7/162
222/64

(Continued)

FOREIGN PATENT DOCUMENTS

CN 212820559 U 3/2021
JP H05-304087 A 11/1993
JP H09-045651 A 2/1997

(Continued)

OTHER PUBLICATIONS

JP H10335226 A translation (Year: 1998).*

(Continued)

*Primary Examiner* — Yewebdar T Tadesse
*Assistant Examiner* — Stephen A Kitt
(74) *Attorney, Agent, or Firm* — Harness, Dickey & Pierce, P.L.C.

(57) ABSTRACT

Provided is a liquid supplying apparatus including: a trap tank for receiving a liquid from a storage bottle in which the liquid is stored and accommodating the received liquid; a pipe for connecting the storage bottle and the trap tank; and a valve installed on the pipe and for opening and closing a flow path of the pipe, in which the valve is installed closer to the storage bottle than the trap tank.

14 Claims, 14 Drawing Sheets

(56) References Cited

U.S. PATENT DOCUMENTS

2001/0009135 A1 * 7/2001 Hasebe .................. G03F 7/162
118/52

FOREIGN PATENT DOCUMENTS

| JP | H10335226 A | * | 12/1998 | |
| JP | 2001-114397 A | | 4/2001 | |
| JP | 2019-134023 A | | 8/2019 | |
| KR | 10-0237191 B1 | | 1/2000 | |
| KR | 10-2007-0107226 A | | 11/2007 | |
| KR | 20070107226 A | * | 11/2007 | ............. B05C 11/10 |
| KR | 101259829 B1 | | 5/2013 | |
| KR | 10-2014-0047636 A | | 4/2014 | |
| KR | 10-2017-0061361 A | | 6/2017 | |
| KR | 101942690 B1 | | 1/2019 | |

OTHER PUBLICATIONS

KR-20070107226-A Translation (Year: 2007).*
Korean Office Action dated May 22, 2023, issued in Korean Patent
Application No. 10-2021-0119980.
Japanese Office Action dated Sep. 12, 2023 issued in corresponding
Japanese Patent Application No. 2022-141297.

* cited by examiner

:Section filled with air by backflow

APPARATUS FOR SUPPLYING LIQUID AND APPARATUS FOR TREATING SUBSTRATE

CROSS-REFERENCE TO RELATED APPLICATIONS

This application claims priority to and the benefit of Korean Patent Application No. 10-2021-0119980 filed in the Korean Intellectual Property Office on Sep. 8, 2021, the entire contents of which are incorporated herein by reference.

TECHNICAL FIELD

The present invention relates to an apparatus for supplying a liquid and an apparatus for treating a substrate.

BACKGROUND ART

A photo-lithography process among semiconductor manufacturing processes is a process of forming a desired pattern on a wafer. The photo-lithography process is usually carried out in a spinner local facility that is connected to an exposure facility and continuously processes a coating process, an exposure process, and a developing process. The spinner facility sequentially or selectively performs a Hexamethyl disilazane (HMDS) process, a coating process, a baking process, and a developing process.

FIG. 1 is a diagram illustrating a liquid supplying apparatus in the related art in a processing apparatus in which a coating process is performed. As illustrated in FIG. 1, in the liquid supplying apparatus which pressurizes a liquid storage bottle 10 by using pressurized gas, such as nitrogen to discharge a liquid (for example, a photoresist) from the liquid storage bottle, when the pressurization is stopped, a backflow in which the liquid flows toward the liquid storage bottle 10 in a path from the liquid storage bottle 10 to a trap tank 920 occurs. When backflow occurs, the section is filled with air. Then, when the liquid in the bottle 10 is pressurized again and the liquid moves to the trap tank 920, the air filled in the pipe is trapped in the liquid, thereby generating a large amount of microbubbles. In addition, since the pipe material is generally hydrophobic that is friendly to air (bubble), the mechanism described above is highly likely to act. In addition, since a coil pipe is applied as a pipe 30, the length of the flow path between a valve 939 and the storage bottle 10 reaches 1500 mm, and backflow occurs largely in this section.

The microbubbles are not easily removed even in the trap tank 920 and are supplied to a substrate along a supply line L2 along with the liquid. The microbubbles contained in the liquid cause defects on the substrate, thereby deteriorating the yield.

FIG. 2 is a diagram illustrating the liquid supplying apparatus in the related art viewed from another angle.

In the case where the pipe 30 in the section connecting the storage bottle 10 to the trap tank 920 is located higher than the storage bottle 10 and the trap tank 920, when the pressurization in the storage bottle 10 stops and the storage bottle 10 becomes to have atmospheric pressure, the liquid in the pipe 90 moves to the storage bottle 10 or the trap tank 920 by gravity. At this time, when backflow in which the liquid moves toward the storage bottle 10 occurs, the section filled with air becomes longer.

FIG. 3 is a graph illustrating the amount of bubbles generated in the pipe of the liquid supplying apparatus in the related art. FIG. 4 is a graph illustrating the amount of bubbles for each bubble size generated in the pipe of the liquid supplying apparatus in the related art. The bubble at the AB-T position referenced in FIG. 1 was observed. When the liquid in the storage bottle 10 is pressurized with pressurized gas, such as nitrogen gas, supplied through a pressurizing pipe 910, the liquid moves to the trap tank 920 by the pressure difference. At this time, a large amount of bubbles are generated in the pipe 30 within 1 second. Unless the storage bottle 10 is positioned higher than the trap tank 920, the generated bubbles are always generated regardless of the height difference (dhB-T) between the storage bottle 10 and the trap tank 920, and most of the bubbles are microbubbles with a diameter of 1 mm or less.

Bubbles cause defects on the wafer, thereby deteriorating the yield.

SUMMARY OF THE INVENTION

The present invention has been made in an effort to provide a liquid supplying apparatus and a substrate treating apparatus capable of efficiently processing a substrate.

The present invention has also been made in an effort to provide a liquid supplying apparatus and a substrate treating apparatus capable of minimizing microbubbles that may be generated in a pipe.

The present invention has also been made in an effort to provide a liquid supplying apparatus and a substrate treating apparatus capable of minimizing microbubbles that may be generated in a pipe while maintaining most of the configuration and arrangement of the liquid supplying apparatus provided in the substrate treating apparatus.

The present invention has also been made in an effort to provide a liquid supplying apparatus and a substrate treating apparatus capable of minimizing a backflow area on a pipe which supplies liquid.

The present invention has also been made in an effort to provide a liquid supplying apparatus and a substrate treating apparatus capable of minimizing the generation of microbubbles while a liquid is supplied.

The problem to be solved by the present invention is not limited to the above-mentioned problems. The problems not mentioned will be clearly understood by those skilled in the art from the descriptions below.

An exemplary embodiment of the present invention provides a liquid supplying apparatus, including: a trap tank for receiving a liquid from a storage bottle in which the liquid is stored and accommodating the received liquid; a pipe for connecting the storage bottle and the trap tank; and a valve installed on the pipe and for opening and closing a flow path of the pipe, in which the valve is installed closer to the storage bottle than the trap tank.

In the exemplary embodiment, the pipe may include a first pipe is coiled pipe, and the valve may be installed upstream the first pipe.

In the exemplary embodiment, the pipe may include: a first pipe shaped like a coil; and an adapter is L-shaped, and the first pipe may connect the valve and the trap tank, and the adapter may connect the storage bottle and the valve.

In the exemplary embodiment, a length of the flow path formed by the adapter may be 20 cm or less.

In the exemplary embodiment, the liquid supplying apparatus may further include: a first pipe for connecting the valve and the trap tank; and a second pipe for connecting the storage bottle and the valve, in which the second pipe may have a length of 20 cm or less.

In the exemplary embodiment, the first pipe may have a partial section located lower than the storage bottle.

In the exemplary embodiment, the storage bottle may be connected to a pressurizing pipe supplying inert gas, and the inert gas may pressurize the liquid.

In the exemplary embodiment, the pipe may be hydrophobic.

In the exemplary embodiment, the trap tank may be provided at the same position as a bottom surface of the storage bottle or at a position higher than the bottom surface of the storage bottle.

In the exemplary embodiment, the liquid supplying apparatus may further include: a first pipe for connecting a first storage bottle and the trap tank; a second pipe for connecting a second storage bottle and the trap tank; a first valve installed on the first pipe to open and close a flow path of the first pipe; and second valve installed on the second pipe to open and close a flow path of the second pipe, in which the first valve may be installed closer to the first storage bottle than the trap tank, and the second valve may be installed closer to the second storage bottle than the trap tank.

In the exemplary embodiment, the liquid may be a photosensitive liquid.

Another exemplary embodiment of the present invention provides a substrate treating apparatus, including: a support unit for maintaining a substrate horizontally; a nozzle for supplying a liquid to the substrate; and a liquid supplying apparatus for supplying a liquid to the nozzle, wherein the liquid supplying apparatus may include: a trap tank for receiving a liquid from a storage bottle in which the liquid is stored and accommodating the received liquid; a pipe for connecting the storage bottle and the trap tank; and valve installed on the pipe and for opening and closing a flow path of the pipe, and the valve may be installed closer to the storage bottle than the trap tank.

In the exemplary embodiment, the pipe may include a first pipe shaped like a coil, and the valve may be installed upstream the first pipe.

In the exemplary embodiment, the pipe may include: a first pipe is coiled pipe; and an adapter is L-shaped, and the first pipe may connect the valve and the trap tank, and the adapter may connect the storage bottle and the valve.

In the exemplary embodiment, a length of the flow path formed by the adapter may be 20 cm or less.

In the exemplary embodiment, the liquid supplying apparatus may further include: a first pipe for connecting the valve and the trap tank; and a second pipe for connecting the storage bottle and the valve, in which the second pipe may have a length of 20 cm or less.

In the exemplary embodiment, the first pipe may have a partial section located lower than the storage bottle.

In the exemplary embodiment, the storage bottle may be connected to a pressurizing pipe supplying inert gas, and the inert gas may pressurize the liquid.

In the exemplary embodiment, the liquid may be a photosensitive liquid.

Still another exemplary embodiment of the present invention provides a substrate treating apparatus, including: a support unit for maintaining a substrate horizontally; a nozzle for supplying a liquid to the substrate; and a liquid supplying apparatus for supplying a liquid to the nozzle, in which the liquid supplying apparatus includes: a first pipe for connecting a first storage bottle and a trap tank; a second pipe for connecting a second storage bottle and the trap tank; a first valve installed on the first pipe to open and close a flow path of the first pipe; and a second valve installed on the second pipe to open and close a flow path of the second pipe, the first pipe includes: a first coil pipe; and a first adapter is L-shaped, and the first coil pipe connects the first valve and the trap tank, and the first adapter connects the first storage bottle and the first valve, the second pipe includes: a second coil pipe; and a second adapter is L-shaped and the second coil pipe connects the second valve and the trap tank, the second adapter connects the second storage bottle and the second valve, a length of the flow path formed by each of the first adapter and the second adapter is 20 cm or less, and each of the first coil pipe and the second coil pipe has a partial section located lower than the storage bottle.

According to the exemplary embodiment of the present invention, it is possible to efficiently treat a substrate.

According to the exemplary embodiment of the present invention, it is possible to minimize microbubbles that may be generated occur in a pipe.

According to the exemplary embodiment of the present invention, it is possible to minimize microbubbles that may be generated occur in a pipe while maintaining most of the configuration and the disposition of the liquid supplying apparatus provided in the substrate treating apparatus.

According to the exemplary embodiment of the present invention, it is possible to minimize a backflow area on a pipe supplying a liquid.

According to the exemplary embodiment of the present invention, it is possible to minimize the generation of microbubbles while the liquid is supplied.

The effect of the present invention is not limited to the foregoing effects, and those skilled in the art may clearly understand non-mentioned effects from the present specification and the accompanying drawings.

DETAILED DESCRIPTION

Figure 1:
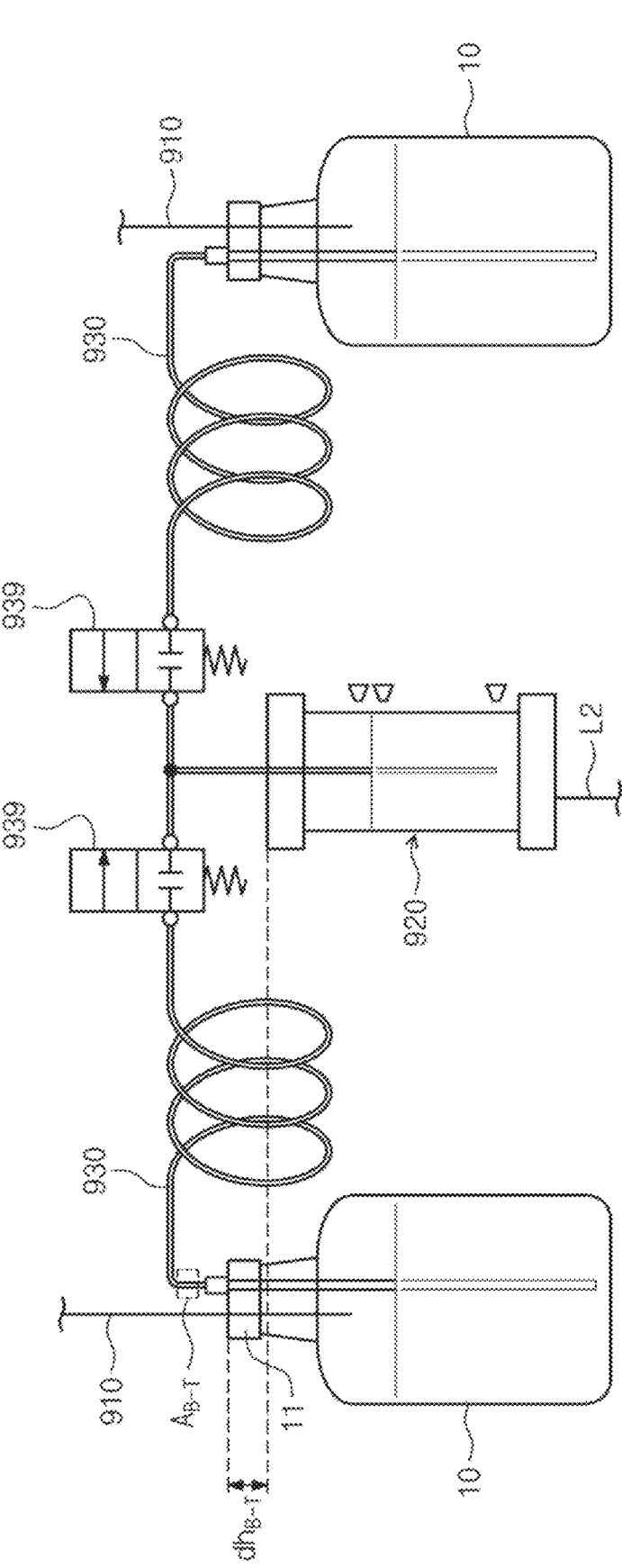
FIG. 1 is a diagram illustrating a liquid supplying apparatus in the related art in a processing apparatus in which a coating process is performed.
Figure 2:
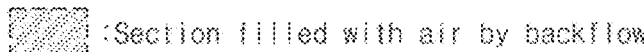
FIG. 2 is a diagram illustrating the liquid supplying apparatus in the related art viewed from another angle.
Figure 3:
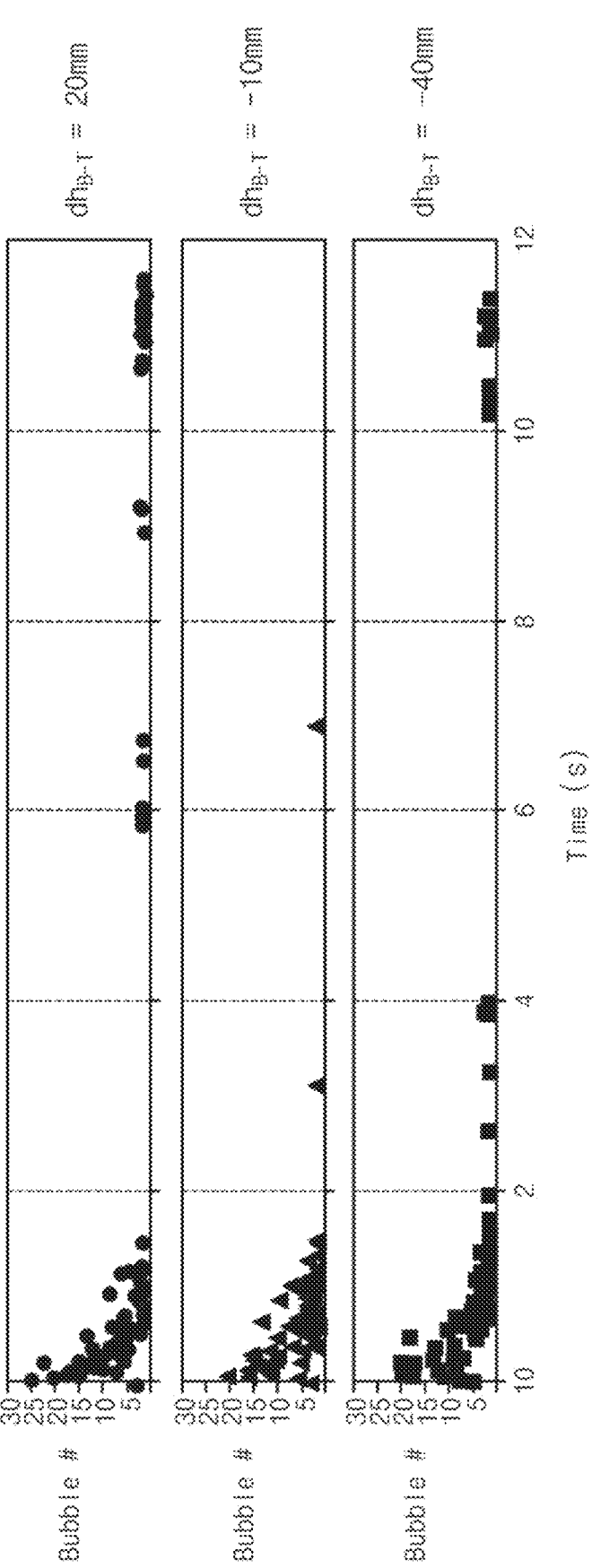
FIG. 3 is a graph illustrating the amount of bubbles generated in the pipe of the liquid supplying apparatus in the related art.
Figure 4:
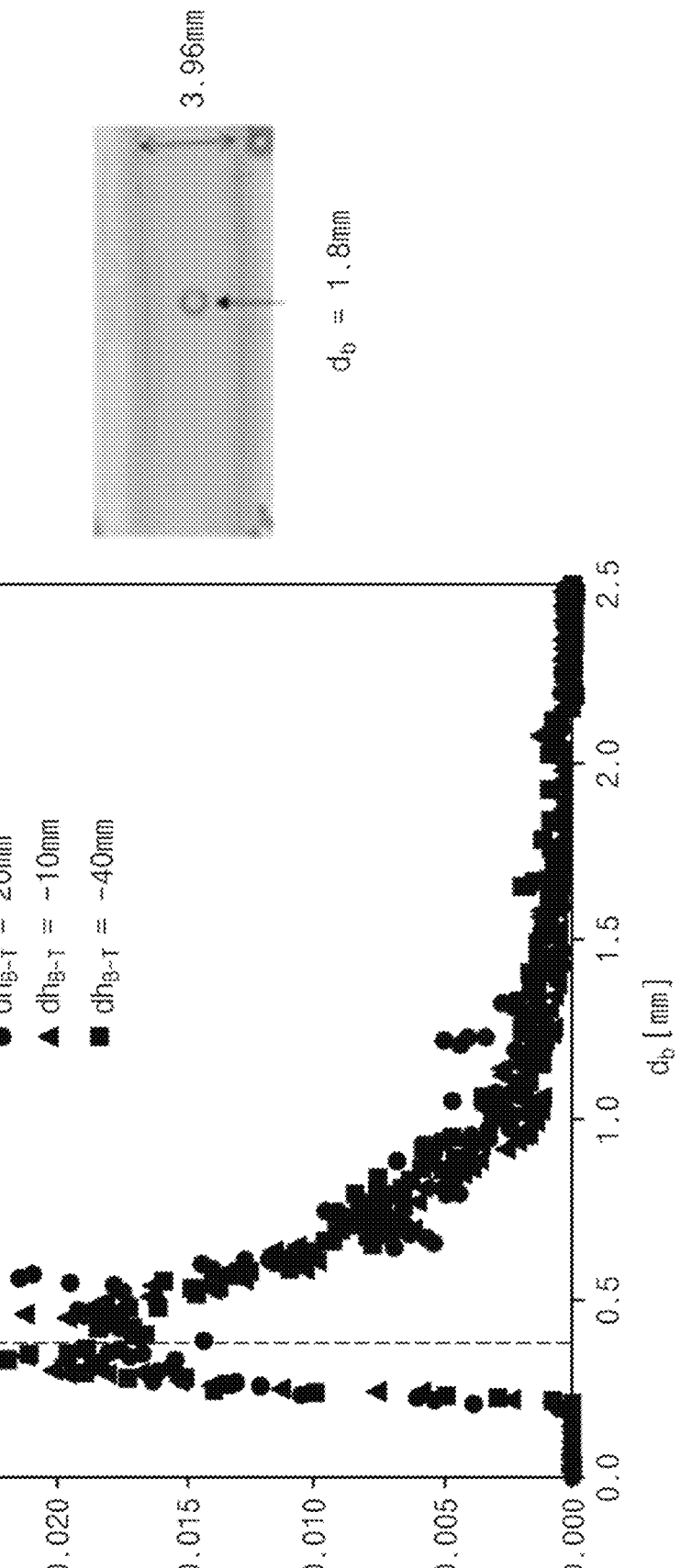
FIG. 4 is a graph illustrating the amount of bubbles for each bubble size generated in the pipe of the liquid supplying apparatus in the related art.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

Singular expressions used herein include plurals expressions unless they have definitely opposite meanings in the context. Accordingly, shapes, sizes, and the like of the elements in the drawing may be exaggerated for clearer description.

The equipment of the present exemplary embodiment may be used to perform a photolithography process on a substrate, such as a semiconductor wafer or a flat panel display panel. In particular, the facility of the present exemplary embodiment may be connected to an exposure apparatus and used to perform a coating process and a developing process on a substrate. Hereinafter, a case in which a wafer is used as a substrate will be described as an example.

Hereinafter, a substrate treating facility of the present invention will be described with reference to FIGS. 5 to 7.

Figure 5:
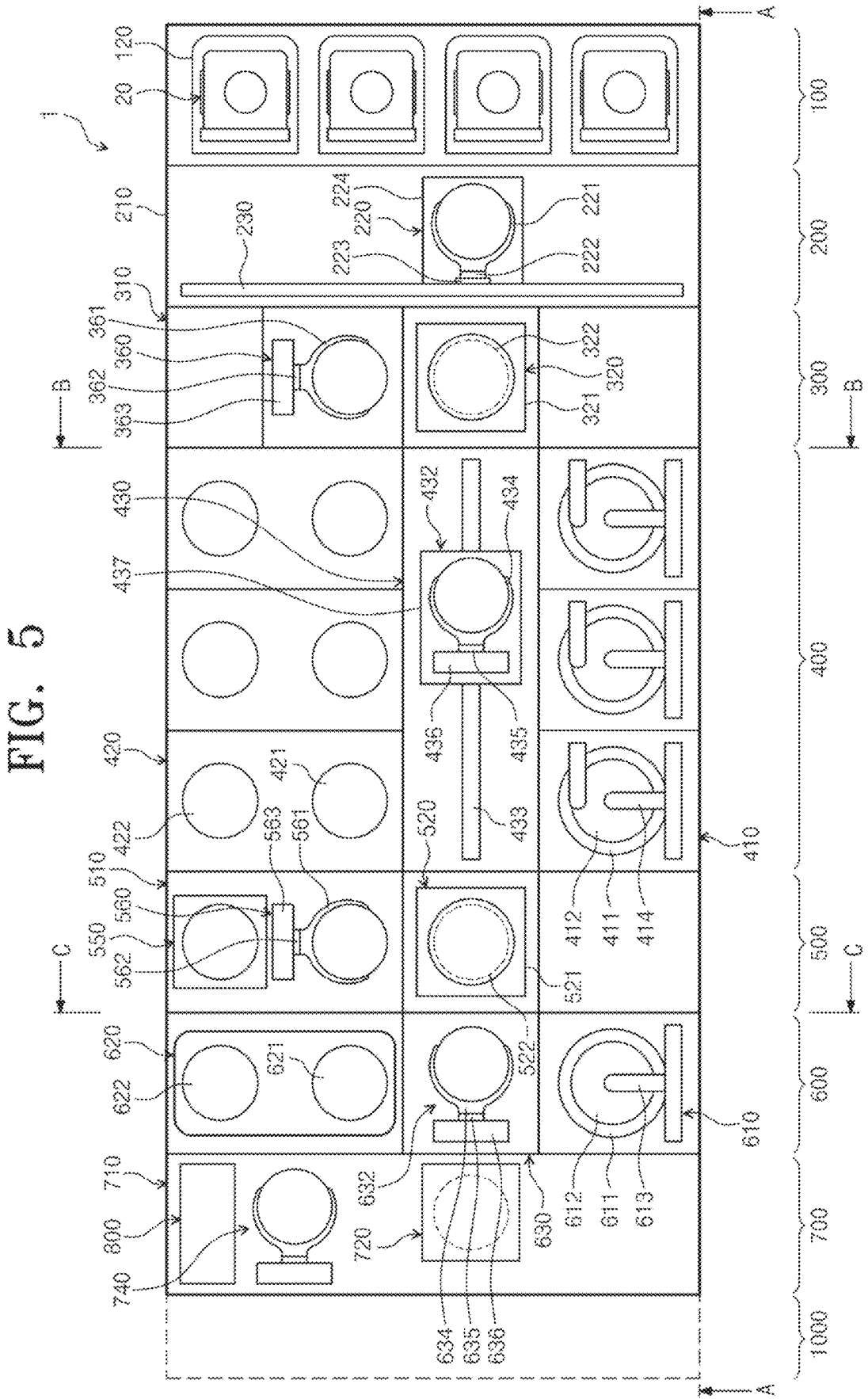
FIG. 5 is a top plan view of a substrate treating facility according to a first exemplary embodiment of the present invention.
Figure 6:
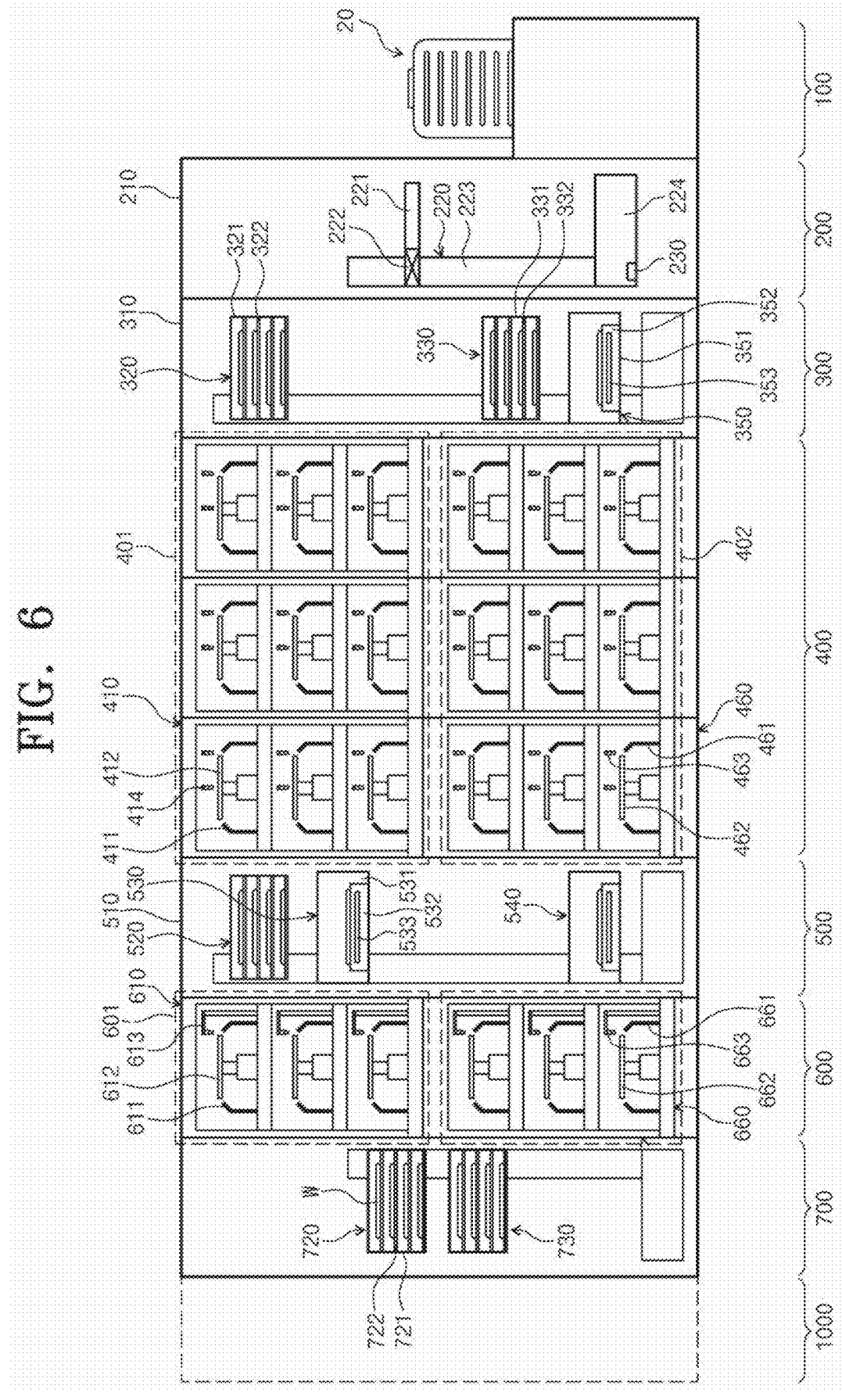
FIG. 6 is a cross-sectional view of the facility of FIG. 5 viewed from in the direction A-A.
Figure 7:
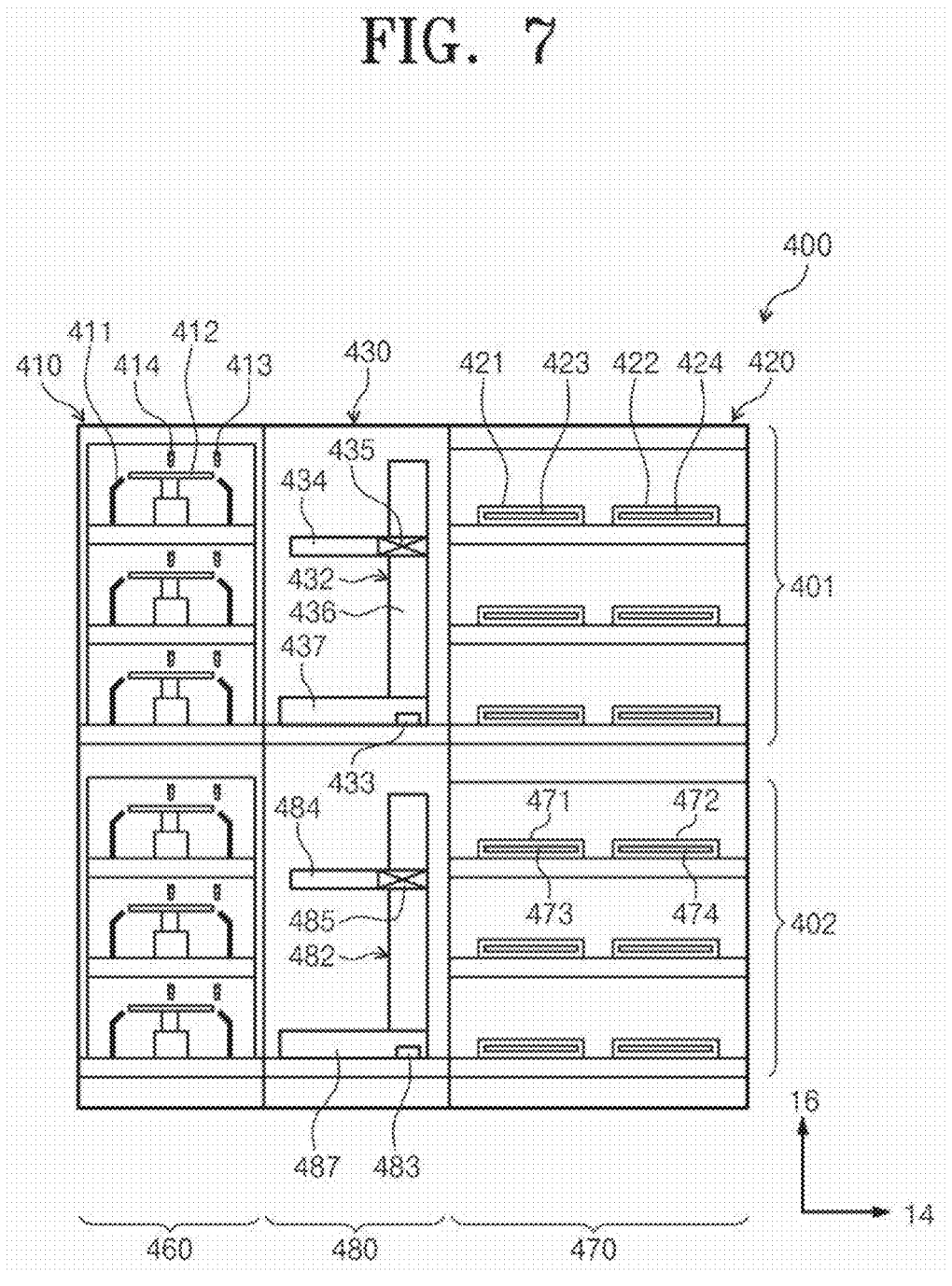
FIG. 7 is a cross-sectional view of the facility of FIG. 5 viewed from in the direction B-B.
Figure 8:
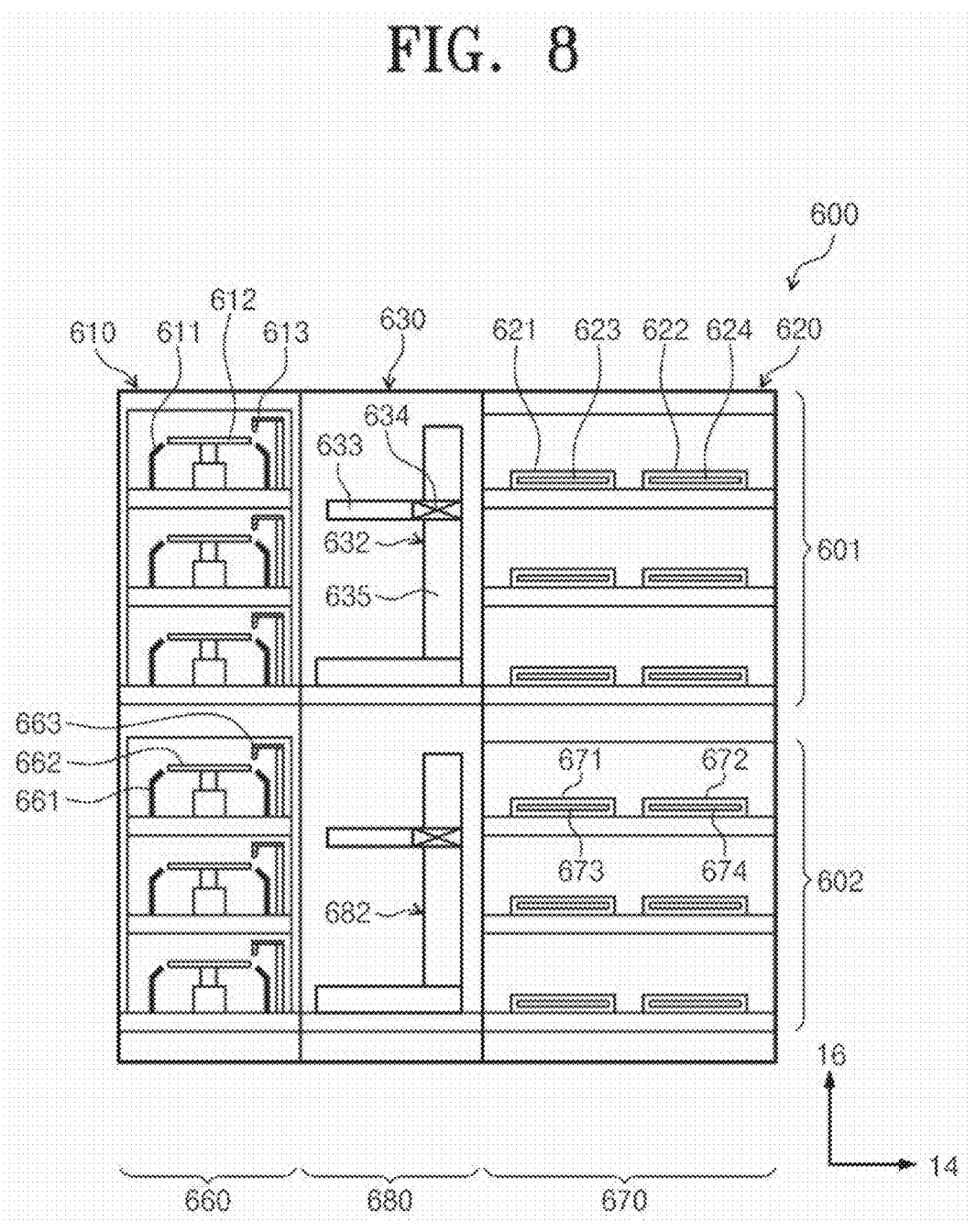
FIG. 8 is a cross-sectional view of the facility of FIG. 5 viewed from in the direction C-C.

FIG. 5 is a view of the substrate treating facility viewed from above, FIG. 6 is a cross-sectional view of the facility of FIG. 5 viewed from in the direction A-A, FIG. 7 is a cross-sectional view of the facility of FIG. 5 viewed from in the direction B-B, and FIG. 8 is a cross-sectional view of the facility of FIG. 5 viewed from in the direction C-C.

Referring to FIGS. 5 to 8, 5 to 8, a substrate treating facility 1 includes a load port 100, an index module 200, a first buffer module 300, a coating and developing module 400, a second buffer module 500, a pre and post-exposure processing module 600, and an interface module 700.

The load port 100, the index module 200, the first buffer module 300, the coating and developing module 400, the second buffer module 500, the pre and post-exposure processing module 600, and the interface module 700 may be sequentially arranged in a line in one direction.

Hereinafter, a direction in which the load port 100, the index module 200, the first buffer module 300, the coating and developing module 400, the second buffer module 500, the pre and post-exposure processing module 600, and the interface module 700 are arranged is arranged is referred to as a first direction 12, when viewed from the top, a direction perpendicular to the first direction 12 is referred to as a second direction 14, and a direction perpendicular to the first direction 12 and the second direction 14 is referred to as a third direction 16.

A substrate W is moved while being accommodated in a cassette 20. In this case, the cassette 20 has a structure that may be sealed from the outside. For example, as the cassette 20, a Front Open Unified Pod (FOUP) having a door at the front may be used.

Hereinafter, the load port 100, the index module 200, the first buffer module 300, the coating and developing module 400, the second buffer module 500, the pre and post-exposure processing module 600, and the interface module 700 will be described in detail.

The load port 100 has a mounting table 120 on which the cassette 20 in which the substrates W are accommodated is placed. A plurality of mounting tables 120 is provided, and the mounting tables 200 are arranged in a line in the second direction 14. In FIG. 5, four mounting tables 120 are provided.

The index module 200 transfers the substrate W between the cassette 20 placed on the mounting table 120 of the load port 100 and the first buffer module 300. The index module 200 includes a frame 210, an index robot 220, and a guide rail 230. The frame 210 is provided in the shape of a rectangular parallelepiped with an empty interior, and is disposed between the load port 100 and the first buffer module 300. The frame 210 of the index module 200 may be provided at a smaller height than a frame 310 of the first buffer module 300 to be described later. The index robot 220 and the guide rail 230 are disposed in the frame 210. The index robot 220 has a structure capable of 4-axis driving so that the hand 221 directly handling the substrate W is movable in the first direction 12, the second direction 14, and the third direction 16, and is rotatable. The index robot 220 includes a hand 221, an arm 222, a support 223, and a pedestal 224. The hand 221 is fixedly installed on the arm 222. The arm 222 is provided in a stretchable structure and a rotatable structure. The support 223 is disposed so that a longitudinal direction thereof is the third direction 16. The arm 222 is coupled to the support 223 to be movable along the support 223. The support 223 is fixedly coupled to the pedestal 224. The guide rail 230 is provided so that a longitudinal direction thereof is disposed in the second direction 14. The pedestal 224 is coupled to the guide rail 230 so as to be linearly movable along the guide rail 230. In addition, although not illustrated, a door opener for opening and closing a door of the cassette 20 is further provided in the frame 210.

The first buffer module 300 includes the frame 310, a first buffer 320, a second buffer 330, a cooling chamber 350, and a first buffer robot 360. The frame 310 is provided in the shape of a rectangular parallelepiped with an empty interior, and is disposed between the index module 200 and the coating and developing module 400. The first buffer 320, the second buffer 330, the cooling chamber 350, and the first buffer robot 360 are positioned in the frame 310. The cooling chamber 350, the second buffer 330, and the first buffer 320 are sequentially disposed in the third direction 16 from the bottom. The first buffer 320 is located at a height corresponding to a coating module 401 of the coating and developing module 400 to be described later, and the second buffer 330 and the cooling chamber 350 are positioned at a height corresponding to a developing module 402 of the coating and developing module 400 to be described later. The first buffer robot 360 is positioned to be spaced apart from the second buffer 330, the cooling chamber 350, and the first buffer 320 by a predetermined distance in the second direction 14.

The first buffer 320 and the second buffer 330 temporarily store the plurality of substrates W, respectively. The second buffer 330 includes a housing 331 and a plurality of supports 332. The supports 332 are disposed in the housing 331 and are provided to be spaced apart from each other in the third direction 16. One substrate W is placed on each support 332. The housing 331 includes openings (not illustrated) in a direction in which the index robot 220 is provided, a direction in which the first buffer robot 360 is provided, and a direction in which a developing unit robot 482 is provided, so that the index robot 220, the first buffer robot 360, and the developing unit robot 482 of the developing module 402 to be described later are capable of loading or unloading the substrate W from the support 332 in the housing 331. The first buffer 320 has a structure substantially similar to that of the second buffer 330. However, the housing 321 of the first buffer 320 includes an opening in the direction in which the first buffer robot 360 is provided and the direction in which a coating robot 432 positioned in the coating module 401 to be described later is provided. The number of supports 322 provided in the first buffer 320 and the number of supports 332 provided in the second buffer 330 may be the same or different. According to an example, the number of supports 332 provided in the second buffer 330 may be greater than the number of supports 322 provided in the first buffer 320.

The first buffer robot 360 transfers the substrate W between the first buffer 320 and the second buffer 330. The first buffer robot 360 includes a hand 361, an arm 362, and a support 363. The hand 361 is fixedly installed on the arm 362. The arm 362 is provided in a stretchable structure, such that the hand 361 is movable in the second direction 14. The arm 362 is coupled to the support 363 so as to be linearly movable in the third direction 16 along the support 363. The support 363 has a length extending from a position corresponding to the second buffer 330 to a position corresponding to the first buffer 320. The support 363 may be provided longer in an upward or downward direction than this. The first buffer robot 360 may simply be provided such that the hand 361 is only driven in two axes in the second direction 14 and the third direction 16.

The cooling chamber 350 cools the substrate W. The cooling chamber 350 has a housing 351 and a cooling plate 352. The cooling plate 352 has a cooling means 353 for cooling an upper surface on which the substrate W is placed and the substrate W. As the cooling means 353, various methods, such as cooling by coolant water or cooling by using a thermoelectric element, may be used. In addition, a lift pin assembly (not illustrated) for positioning the substrate W on the cooling plate 352 may be provided in the cooling chamber 350. The housing 351 includes openings (not illustrated) in the direction in which the index robot 220 is provided and a direction in which the developing unit robot 482 is provided, so that the index robot 220 and the developing unit robot 482 provided in the developing module 402 to be described later are capable of loading or unloading the substrate W from the cooling plate 352. Also, the cooling chamber 350 may be provided with doors (not illustrated) for opening and closing the openings.

The coating and developing module 400 performs a process of coating a photoresist on the substrate W before the exposure process and a process of developing the substrate W after the exposure process. The coating and developing module 400 generally has a rectangular parallelepiped shape. The coating and developing module 400 includes the coating module 401 and the developing module 402. The coating module 401 and the developing module 402 are arranged to be partitioned between each other in layers. According to an example, the coating module 401 is located above the developing module 402.

The coating module 401 performs a process of coating a photosensitive liquid, such as a photoresist, to the substrate W and a heat treatment process, such as heating and cooling, on the substrate W before and after the resist coating process. The coating module 401 includes a resist coating chamber 410, a bake chamber 420, and a transfer chamber 430. The resist coating chamber 410, the bake chamber 420, and the transfer chamber 430 are sequentially disposed in the second direction 14. Accordingly, the resist coating chamber 410 and the bake chamber 420 are positioned while being spaced apart from each other in the second direction 14 with the transfer chamber 430 interposed therebetween. A plurality of resist coating chambers 410 is provided, and a plurality of resist coating chambers are provided in each of the first direction 12 and the third direction 16. In the drawing, an example in which six resist coating chambers 410 are provided is illustrated. A plurality of bake chambers 420 is provided in each of the first direction 12 and the third direction 16. In the drawing, an example in which six bake chambers 420 are provided is illustrated. However, alternatively, a larger number of bake chambers 420 may be provided.

The transfer chamber 430 is positioned in parallel with the first buffer 320 of the first buffer module 300 in the first direction 12. The coating unit robot 432 and a guide rail 433 are positioned in the transfer chamber 430. The transfer chamber 430 has a generally rectangular shape. The coating unit robot 432 transfers the substrate W between the bake chambers 420, the resist coating chambers 410, the first buffer 320 of the first buffer module 300, and a first cooling chamber 520 of the second buffer module 500 to be described later. The guide rail 433 is disposed so that a longitudinal direction thereof is parallel to the first direction 12. The guide rail 433 guides the coating unit robot 432 to move linearly in the first direction 12. The coating unit robot 432 includes a hand 434, an arm 435, a support 436, and a pedestal 437. The hand 434 is fixedly installed on the arm 435. The arm 435 is provided in a stretchable structure so that the hand 434 is movable in the horizontal direction. The support 436 is provided such that a longitudinal direction thereof is disposed along the third direction 16. The arm 435 is coupled to the support 436 so as to be linearly movable in the third direction 16 along the support 436. The support 436 is fixedly coupled to the pedestal 437, and the pedestal 437 is coupled to the guide rail 433 to be movable along the guide rail 433.

The resist coating chambers 410 all have the same structure. However, the types of photoresists used in the resist coating chambers 410 may be different from each other. As an example, a chemical amplification resist may be used as the photoresist. The resist coating chamber 410 coats a photoresist on the substrate W.

The resist coating chamber 410 includes a housing 411, a support plate 412, and a nozzle 413. The housing 411 has a cup shape with an open top. The support plate 412 is positioned in the housing 411 and supports the substrate W. The support plate 412 is provided rotatably. The nozzle 413 supplies the photoresist onto the substrate W placed on the support plate 412. The nozzle 413 has a circular tubular shape, and may supply a photoresist to the center of the substrate W. Optionally, the nozzle 413 may have a length corresponding to the diameter of the substrate W, and an outlet of the nozzle 413 may be provided as a slit. In addition, a nozzle 414 for supplying a cleaning solution, such as deionized water, to clean the surface of the substrate W on which the photoresist is coated may be further provided in the resist coating chamber 410.

Referring back to FIGS. 5 to 8, the bake chamber 420 heat-treats the substrate W. For example, the bake chambers 420 performs a prebake process of heating the substrate W to a predetermined temperature before coating the photoresist to remove organic matter or moisture on the surface of the substrate W or a soft bake process performed after coating the photoresist on the substrate W, and performs a cooling process of cooling the substrate W after each heating process. The bake chamber 420 includes a cooling plate 421 or a heating plate 422. The cooling plate 421 is provided with a cooling means 423, such as coolant or a thermoelectric element. The heating plate 422 is also provided with a heating means 424, such as a hot wire or a thermoelectric element. Each of the cooling plate 421 and the heating plate 422 may be provided in one bake chamber 420. Optionally, some of the bake chambers 420 may include only the cooling plate 421, and some may include only the heating plate 422.

The developing module 402 performs a developing process for removing a part of the photoresist by supplying a developer solution to obtain a pattern on the substrate W, and a heat treatment process, such as heating and cooling, performed on the substrate W before and after the developing process. The developing module 402 includes a developing chamber 460, a bake chamber 470, and a transfer chamber 480. The developing chamber 460, the bake chamber 470, and the transfer chamber 480 are sequentially disposed along the second direction 14. Accordingly, the developing chamber 460 and the bake chamber 470 are positioned to be spaced apart from each other in the second direction 14 with the transfer chamber 480 interposed therebetween. A plurality of developing chambers 460 is provided, and a plurality of developing chambers 460 is provided in each of the first direction 12 and the third direction 16. In the drawing, an example in which six developing chambers 460 are provided is illustrated. A plurality of bake chambers 470 is provided in each of the first direction 12 and the third direction 16. In the drawing, an example in which six bake chambers 470 are provided is illustrated. However, alternatively, a larger number of bake chambers 470 may be provided.

The transfer chamber 480 is positioned in parallel with the second buffer 330 of the first buffer module 300 in the first direction 12. The developing unit robot 482 and a guide rail 483 are positioned in the transfer chamber 480. The transfer chamber 480 has a generally rectangular shape. The developing unit robot 482 transfers the substrate W between the bake chambers 470, the developing chambers 460, the second buffer 330 and the cooling chamber 350 of the first buffer module 300, and the second cooling chamber 540 of the second buffer module 500. The guide rail 483 is disposed so that a longitudinal direction thereof is parallel to the first direction 12. The guide rail 483 guides the developing unit robot 482 to move linearly in the first direction 12. The developing unit robot 482 includes a hand 484, an arm 485, a support 486, and a pedestal 487. The hand 484 is fixedly installed on the arm 485. The arm 485 is provided in a stretchable structure so that the hand 484 is movable in the horizontal direction. The support 486 is provided such that a longitudinal direction thereof is disposed along the third direction 16. The arm 485 is coupled to the support 486 so as to be linearly movable in the third direction 16 along the support 486. The support 486 is fixedly coupled to the pedestal 487. The pedestal 487 is coupled to the guide rail 483 so as to be movable along the guide rail 483.

The developing chambers 460 all have the same structure. However, the types of developer used in the developing chambers 460 may be different from each other. The developing chamber 460 removes a region irradiated with light from the photoresist on the substrate W. At this time, the region irradiated with light among a passivation film is also removed. Only a region to which light is not irradiated among regions of the photoresist and the passivation layer may be removed according to the type of the selectively used photoresist.

The developing chamber 460 includes a housing 461, a support plate 462, and a nozzle 463. The housing 461 has a cup shape with an open top. The support plate 462 is positioned in the housing 461 and supports the substrate W. The support plate 462 is provided rotatably. The nozzle 463 supplies the developer onto the substrate W placed on the support plate 462. The nozzle 463 has a circular tubular shape, and may supply a developer to the center of the substrate W. Optionally, the nozzle 463 may have a length corresponding to the diameter of the substrate W, and an outlet of the nozzle 463 may be provided as a slit. In addition, a nozzle 464 for supplying a cleaning solution, such as deionized water, to clean the surface of the substrate W to which the developer is additionally supplied may be further provided in the developing chamber 460.

The bake chamber 470 of the developing module 402 heats the substrate W. For example, the bake chambers 470 performs a post-bake process of heating the substrate W before the developing process is performed, a hard bake process of heating the substrate W after the developing process is performed, and a cooling process of cooling the heated wafer after each bake process. The bake chamber 470 includes a cooling plate 471 or a heating plate 472. The cooling plate 471 is provided with a cooling means 473, such as coolant or a thermoelectric element. Alternatively, the heating plate 472 is provided with heating means 474, such as a hot wire or a thermoelectric element. Each of the cooling plate 471 and the heating plate 472 may be provided in one bake chamber 470. Optionally, some of the bake chambers 470 may include only the cooling plate 471, and some may include only the heating plate 472.

As described above, in the coating and developing module 400, the coating module 401 and the developing module 402 are provided to be separated from each other. Also, when viewed from above, the coating module 401 and the developing module 402 may have the same chamber arrangement.

The second buffer module 500 is provided as a passage through which the substrate W is transferred between the coating and developing module 400 and the pre and post-exposure processing module 600.

In addition, the second buffer module 500 performs a predetermined process, such as a cooling process or an edge exposure process, on the substrate W. The second buffer module 500 includes a frame 510, a buffer 520, a first cooling chamber 530, a second cooling chamber 540, an edge exposure chamber 550, and a second buffer robot 560. The frame 510 has a rectangular parallelepiped shape. The buffer 520, the first cooling chamber 530, the second cooling chamber 540, the edge exposure chamber 550, and the second buffer robot 560 are positioned in the frame 510. The buffer 520, the first cooling chamber 530, and the edge exposure chamber 550 are disposed at a height corresponding to the height of the coating module 401. The second cooling chamber 540 is disposed at a height corresponding to the height of the developing module 402. The buffer 520, the first cooling chamber 530, and the second cooling chamber 540 are sequentially arranged in a line along the third direction 16. When viewed from the top, the buffer 520 is disposed with the transfer chamber 430 of the coating module 401 in the first direction 12. The edge exposure chamber 550 is spaced apart from the buffer 520 or the first cooling chamber 530 by a predetermined distance in the second direction 14.

The second buffer robot 560 transfers the substrate W between the buffer 520, the first cooling chamber 530, and the edge exposure chamber 550. The second buffer robot 560 is positioned between the edge exposure chamber 550 and the buffer 520. The second buffer robot 560 may be provided in a structure similar to that of the first buffer robot 360. The first cooling chamber 530 and the edge exposure chamber 550 perform a subsequent process on the wafers W that have been processed in the coating module 401. The first cooling chamber 530 cools the substrate W on which the process has been performed in the coating module 401. The first cooling chamber 530 has a structure similar to that of the cooling chamber 350 of the first buffer module 300. The edge exposure chamber 550 exposes the edges of the wafers W on which the cooling process has been performed in the first cooling chamber 530. The buffer 520 temporarily stores the substrates W before the substrates W, which have been processed in the edge exposure chamber 550, are transferred to a pre-processing module 601, which will be described later. The second cooling chamber 540 cools the wafers W before the wafers W, which have been processed in a post-processing module 602 to be described later, are transferred to the developing module 402. The second buffer module 500 may further include a buffer added to a height corresponding to that of the developing module 402. In this case, the wafers W, which have been processed in the post-processing module 602, may be temporarily stored in an added buffer and then transferred to the developing module 402.

When the exposure apparatus 1000 performs an immersion exposure process, the pre and post-exposure processing module 600 may perform a process of applying a passivation layer protecting the photoresist layer coated on the substrate W during immersion exposure.

Also, the pre and post-exposure processing module 600 may perform a process of cleaning the substrate W after exposure.

In addition, when the coating process is performed by using the chemically amplified resist, the pre and post-exposure processing module 600 may perform a bake process after exposure.

The pre and post-exposure processing module 600 includes a pre-processing module 601 and a post-processing module 602. The pre-processing module 601 performs a process of treating the substrate W before performing the exposure process, and the post-processing module 602 performs a process of treating the substrate W after the exposure process. The pre-processing module 601 and the post-processing module 602 are arranged to be partitioned between each other in layers. According to an example, the pre-processing module 601 is located above the post-processing module 602. The pre-processing module 601 is provided at the same height as the coating module 401. The post-processing module 602 is provided at the same height as the developing module 402. The pre-processing module 601 includes a passivation layer coating chamber 610, a bake chamber 620, and a transfer chamber 630. The passivation layer coating chamber 610, the transfer chamber 630, and the bake chamber 620 are sequentially arranged along the second direction 14. Accordingly, the passivation layer coating chamber 610 and the bake chamber 620 are positioned to be spaced apart from each other in the second direction 14 with the transfer chamber 630 interposed therebetween. A plurality of passivation film coating chambers 610 is provided and is arranged along the third direction 16 to form a layer on each other. Optionally, a plurality of passivation film coating chambers 610 may be provided in each of the first direction 12 and the third direction 16. A plurality of bake chambers 620 is provided and is arranged along the third direction 16 to form a layer on each other. Optionally, a plurality of bake chambers 620 may be provided in each of the first direction 12 and the third direction 16.

The transfer chamber 630 is positioned in parallel with the first cooling chamber 530 of the second buffer module 500 in the first direction 12. A pre-processing robot 632 is located in the transfer chamber 630. The transfer chamber 630 has a generally square or rectangular shape. The pre-processing robot 632 transfers the substrate W between the passivation film coating chambers 610, the bake chambers 620, the buffer 520 of the second buffer module 500, and the first buffer 720 of the interface module 700 to be described later. The pre-processing robot 632 includes a hand 633, an arm 634, and a support 635. The hand 633 is fixedly installed on the arm 634. The arm 634 is provided in a stretchable structure and a rotatable structure. The arm 634 is coupled to the support 635 so as to be linearly movable in the third direction 16 along the support 635.

The passivation film coating chamber 610 applies a passivation film for protecting the resist film during immersion exposure on the substrate W. The passivation film coating chamber 610 includes a housing 611, a support plate 612, and a nozzle 613. The housing 611 has a cup shape with an open top. The support plate 612 is positioned in the housing 611 and supports the substrate W. The support plate 612 is provided rotatably. The nozzle 613 supplies a protective liquid for forming a passivation film onto the substrate W placed on the support plate 612. The nozzle 613 has a circular tubular shape, and may supply a protective liquid to the center of the substrate W. Optionally, the nozzle 613 may have a length corresponding to the diameter of the substrate W, and an outlet of the nozzle 613 may be provided as a slit. In this case, the support plate 612 may be provided in a fixed state. The protective liquid contains a foaming material. As the protective liquid, a material with low affinity for photoresist and water may be used. For example, the protective liquid may contain a fluorine-based solvent. The passivation film coating chamber 610 supplies the protective liquid to the central region of the substrate W while rotating the substrate W placed on the support plate 612.

The bake chamber 620 heat-treats the substrate W on which the passivation film is coated. The bake chamber 620 has a cooling plate 621 or a heating plate 622. The cooling plate 621 is provided with a cooling means 623, such as coolant or a thermoelectric element. Alternatively, the heating plate 622 is provided with heating means 624, such as a hot wire or a thermoelectric element. Each of the heating plate 622 and the cooling plate 621 may be provided in one bake chamber 620. Optionally, some of the bake chambers 620 may include only the heating plate 622, and some may include only the cooling plate 621.

The post-processing module 602 includes a cleaning chamber 660, a post-exposure bake chamber 670, and a transfer chamber 680. The cleaning chamber 660, the transfer chamber 680, and the post-exposure bake chamber 670 are sequentially disposed along the second direction 14. Accordingly, the cleaning chamber 660 and the post-exposure bake chamber 670 are positioned to be spaced apart from each other in the second direction 14 with the transfer chamber 680 interposed therebetween. A plurality of cleaning chambers 660 may be provided and may be disposed along the third direction 16 to form a layer on each other. Optionally, a plurality of cleaning chambers 660 may be provided in each of the first direction 12 and the third direction 16. A plurality of post-exposure bake chambers 670 may be provided, and may be disposed along the third direction 16 to form a layer on each other. Optionally, a plurality of post-exposure bake chambers 670 may be provided in each of the first direction 12 and the third direction 16.

The transfer chamber 680 is positioned in parallel with the second cooling chamber 540 of the second buffer module 500 in the first direction 12 when viewed from the top. The transfer chamber 680 has a generally square or rectangular shape. A post-processing robot 682 is located within the transfer chamber 680. The post-processing robot 682 transfers the substrate W between the cleaning chambers 660, the post-exposure bake chambers 670, the second cooling chamber 540 of the second buffer module 500, and a second buffer 730 of the interface module 700 to be described later. The post-processing robot 682 provided in the post-processing module 602 may be provided in the same structure as the pre-processing robot 632 provided in the pre-processing module 601.

The cleaning chamber 660 cleans the substrate W after the exposure process. The cleaning chamber 660 includes a housing 661, a support plate 662, and a nozzle 663. The housing 661 has a cup shape with an open top. The support plate 662 is located in the housing 661 and supports the substrate W. The support plate 662 is provided rotatably. The nozzle 663 supplies a cleaning liquid onto the substrate W placed on the support plate 662. As the cleaning solution, water, such as deionized water, may be used. The cleaning chamber 660 supplies the cleaning liquid to the central region of the substrate W while rotating the substrate W placed on the support plate 662. Optionally, the nozzle 663 may move linearly or rotationally from the center region of the substrate W to the edge region while the substrate W is rotated. The post-exposure bake chamber 670 heats the substrate W on which the exposure process has been performed by using deep ultraviolet rays. In the post-exposure bake process, the substrate W is heated to amplify the acid generated in the photoresist by exposure to complete the change in the properties of the photoresist. The post-exposure bake chamber 670 includes the heating plate 672. The heating plate 672 is provided with a heating means 674, such as a hot wire or thermoelectric element. The post-exposure bake chamber 670 may further include a cooling plate 671 therein. The cooling plate 671 is provided with a cooling means 673, such as coolant or a thermoelectric element. In addition, optionally, a bake chamber including only the cooling plate 671 may be further provided.

As described above, in the pre-exposure processing module 600, the pre-processing module 601 and the post-processing module 602 are provided to be completely separated from each other. In addition, the transfer chamber 630 of the pre-processing module 601 and the transfer chamber 680 of the post-processing module 602 may be provided to have the same size to completely overlap each other when viewed from the top. In addition, the passivation film coating chamber 610 and the cleaning chamber 660 may be provided to have the same size to completely overlap each other when viewed from the top. Also, the bake chamber 620 and the post-exposure bake chamber 670 may be provided to have the same size to completely overlap each other when viewed from the top.

The interface module 700 transfers the substrate W between the pre and post-exposure processing module 600 and the exposure apparatus 1000. The interface module 700 includes a frame 710, a first buffer 720, a second buffer 730, and an interface robot 740. The first buffer 720, the second buffer 730, and the interface robot 740 are positioned in the frame 710. The first buffer 720 and the second buffer 730 are spaced apart from each other by a predetermined distance and are arranged to be stacked on each other. The first buffer 720 is disposed higher than the second buffer 730. The first buffer 720 is positioned at a height corresponding to the pre-processing module 601, and the second buffer 730 is positioned at a height corresponding to the post-processing module 602. When viewed from the top, the first buffer 720 is arranged in a line with the transfer chamber 630 of the pre-processing module 601 along the first direction 12, and the second buffer 730 is arranged in a line with the transfer chamber 630 of the post-processing module 602 along the first direction 12.

The interface robot 740 is positioned to be spaced apart from the first buffer 720 and the second buffer 730 in the second direction 14. The interface robot 740 transfers the substrate W between the first buffer 720, the second buffer 730, and the exposure apparatus 1000. The interface robot 740 has a structure substantially similar to that of the second buffer robot 560.

The first buffer 720 temporarily stores the substrates W, which have been processed in the pre-processing module 601, before the substrates W are moved to the exposure apparatus 1000. In addition, the second buffer 730 temporarily stores the substrates W, which have been processed in the exposure apparatus 1000, before the substrates W are moved to the post-processing module 602. The first buffer 720 includes a housing 721 and a plurality of supports 722. The supports 722 are disposed within the housing 721 and are provided to be spaced apart from each other along the third direction 16. One substrate W is placed on each support 722. The housing 721 has an opening (not illustrated) in the direction in which the interface robot 740 is provided and the direction in which the pre-processing robot 632 is provided so that the interface robot 740 and the pre-processing robot 632 are capable of loading or unloading the substrate W placed on the support 722 into or from the housing 721. The second buffer 730 has a structure substantially similar to that of the first buffer 720. However, the housing 4531 of the second buffer 730 has an opening (not illustrated) in the direction in which the interface robot 740 is provided and the direction in which the post-processing robot 682 is provided. As described above, only the buffers and the robot may be provided in the interface module without providing a chamber for performing a predetermined process on the wafer.

The resist coating chamber 410 may be provided as a substrate treating apparatus for coating a photoresist on the substrate W, which will be described below.

Figure 9:
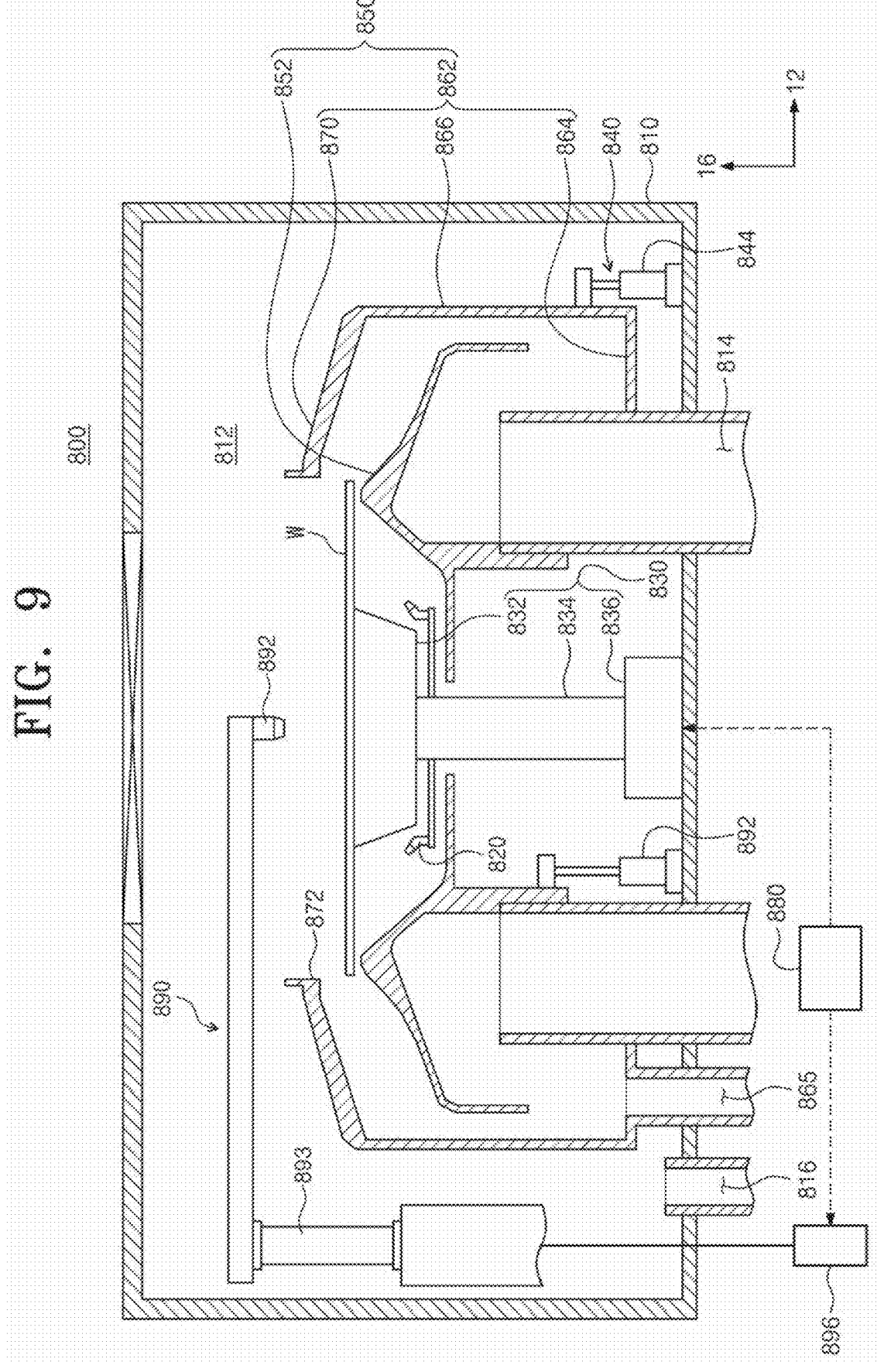
FIG. 9 is a cross-sectional view illustrating a substrate treating apparatus according to an exemplary embodiment.

FIG. 9 is a cross-sectional view illustrating the substrate treating apparatus of FIG. 6.

Referring to FIG. 9, a substrate treating apparatus 800 is an apparatus for coating a photoresist on a substrate W. The substrate treating apparatus 800 may include a housing 810, a substrate support unit 830, a processing container 850, a lifting unit 840, an injection unit 890, and a control unit 880.

The housing 810 is provided in a rectangular tubular shape having a processing space 812 therein. An opening (not illustrated) is formed at one side of the housing 810. The opening functions as an inlet through which the substrate W is loaded and unloaded. A door is installed in the opening, and the door opens and closes the opening. When the substrate treating process is performed, the door closes the opening to seal the processing space 812 of the housing 810. An inner exhaust port 814 and an outer exhaust port 816 are formed in a lower surface of the housing 810. The airflow formed in the housing 810 is exhausted to the outside through the inner exhaust port 814 and the outer exhaust port 816. According to an example, the airflow provided in the processing container 850 may be exhausted through the inner exhaust port 814, and the airflow provided outside the processing container 850 may be exhausted through the outer exhaust port 816.

The substrate support unit 830 supports the substrate W in the processing space 812 of the housing 810. The substrate support unit 830 rotates the substrate W. The substrate support unit 830 includes a spin chuck 832, a rotation shaft 834, and a driver 836. The spin chuck 832 serves as a substrate support member 832 for supporting a substrate. The spin chuck 832 is provided to have a circular plate shape. The substrate W is in contact with the upper surface of the spin chuck 832. The spin chuck 832 is provided to have a smaller diameter than the substrate W. According to an example, the spin chuck 832 may chuck the substrate W by vacuum sucking the substrate W. Optionally, the spin chuck 832 may be provided as an electrostatic chuck for chucking the substrate W using static electricity. Also, the spin chuck 832 may chuck the substrate W with physical force.

Meanwhile, a cleaning jig 900 may be seated on the spin chuck 832 during the cleaning process of the processing container 850.

The rotation shaft 834 and the driver 836 are provided as rotation driving members 834 and 836 for rotating the spin chuck 832. The rotation shaft 834 supports the spin chuck 832 under the spin chuck 832. The rotation shaft 834 is provided so that the longitudinal direction thereof faces the vertical direction. The rotation shaft 834 is provided to be rotatable about its central axis. The driver 836 provides driving force to rotate the rotation shaft 834. For example, the driver 836 may be a motor capable of varying a rotational speed of the rotation shaft. The rotation driving members 834 and 836 may rotate the spin chuck 832 at different rotation speeds depending on the substrate treating operation.

The processing container 850 provides a processing space 812 therein in which a developing process is performed. The processing container 850 serves to surround the substrate support unit 830. The processing container 850 is provided to have a cup shape with an open top. The processing vessel 850 includes an inner cup 852 and an outer cup 862.

The inner cup 852 is provided in a circular cup shape surrounding the rotation shaft 834. When viewed from the top, the inner cup 852 is positioned to overlap the inner exhaust port 814. When viewed from the top, the upper surface of the inner cup 852 is provided such that the outer and inner regions thereof are inclined at different angles from each other. According to an example, the outer region of the inner cup 852 faces a downward inclination direction as it moves away from the substrate support unit 830, and the inner region of the inner cup 852 faces an upward inclination direction as it moves away from the substrate support unit 830. A point where the outer region and the inner region of the inner cup 852 meet each other is provided to correspond to the side end of the substrate W in the vertical direction. An outer region of the upper surface of the inner cup 852 is provided to be rounded. The outer region of the upper surface of the inner cup 852 is provided concave downwards. The outer region of the upper surface of the inner cup 852 is provided as an area through which a liquid flows.

The outer cup 862 is provided to have a cup shape surrounding the substrate support unit 830 and the inner cup 852. The outer cup 862 has a bottom wall 864, a side wall 866, a top wall 870, and an inclined wall 870. The bottom wall 864 is provided to have a circular plate shape having a hollow. A return line 865 is formed in the bottom wall 864. The recovery line 865 recovers the liquid supplied on the substrate W. The liquid recovered by the recovery line 865 may be reused by an external liquid recycling system. The sidewall 866 is provided to have a circular cylindrical shape surrounding the substrate support unit 830. The side wall 866 extends in a vertical direction from the side end of the bottom wall 864. A sidewall 866 extends upwardly from a bottom wall 864.

The inclined wall 870 extends from the top end of the sidewall 866 in an inward direction of the outer cup 862. The inclined wall 870 is provided to be closer to the substrate support unit 830 as it goes upward. The inclined wall 870 is provided to have a ring shape. The upper end of the inclined wall 870 is positioned higher than the substrate W supported by the substrate support unit 830.

The lifting unit 840 moves each of the inner cup 852 and the outer cup 862 up and down. The lifting unit 840 includes an inner moving member 842 and an outer moving member 844. The inner moving member 842 moves the inner cup 852 up and down, and the outer moving member 844 moves the outer cup 862 up and down.

The injection unit 890 may selectively supply various types of processing fluids onto the substrate W.

Figure 10:
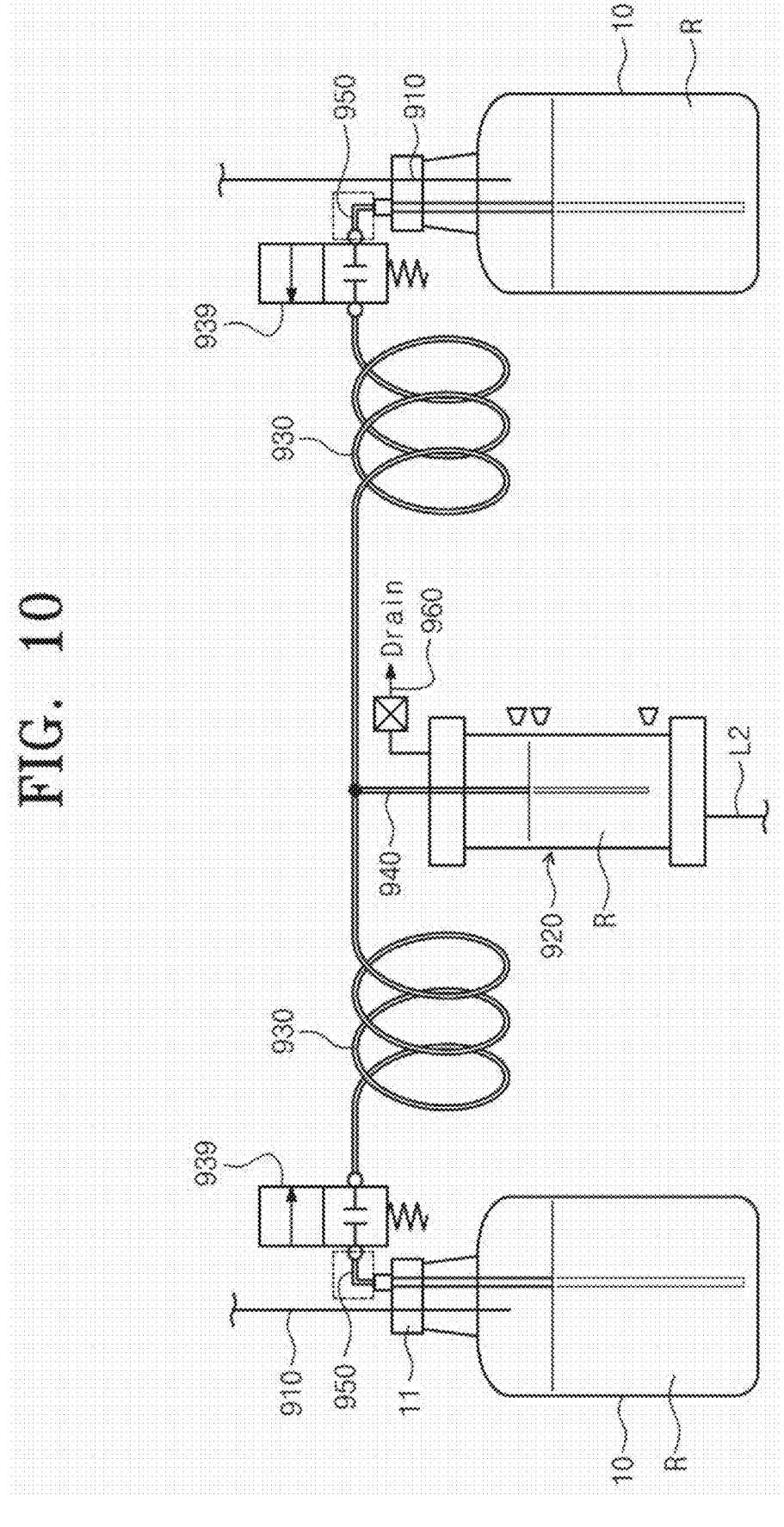
FIG. 10 is a diagram illustrating a liquid supplying apparatus according to a first exemplary embodiment of the present invention.

For example, the injection unit 890 may include a nozzle 892 for supplying a liquid to the substrate W and a nozzle moving member 893. A plurality of nozzles 892 may be provided. When a plurality of nozzles 892 is provided, a liquid supplying apparatus is connected to each of the nozzles 892. An example of the liquid supplying apparatus is illustrated in FIG. 10. Among the plurality of nozzles 892, the nozzles 892, except for the nozzles held by the nozzle moving member 893 in order to discharge the liquid onto the substrate, are in standby at a home port (not illustrated). One of the plurality of nozzles 892 is movable to a process position and a standby position by the nozzle moving member 893. Here, the process position is a position where the nozzle 892 faces the substrate W placed on the spin chuck 832. The standby position is a position where the nozzle 892 is standby for the home port 900. For example, the liquid may be a photosensitive liquid, such as a photoresist, or a cleaning liquid used for cleaning the processing container.

FIG. 10 is a diagram illustrating a liquid supplying apparatus according to a first exemplary embodiment of the present invention. The liquid supplying apparatus according to an exemplary embodiment is an apparatus for supplying a photoresist.

Referring to FIG. 10, the liquid supplying apparatus 900 may include a storage bottle 910, a trap tank 920, and a first pipe 930.

The storage bottle 910 is filled with a liquid. A pressurized gas supply pipe 910 and an adapter 950 are connected to the storage bottle 910. Inert gas (helium gas or nitrogen gas) is supplied to the storage bottle 910 in order to make the sealed inside be the inert gas atmosphere and the pressurized state through the pressurized gas supply pipe 910. The inert gas is supplied at a pressure set through a regulator (not illustrated). Due to the change in internal pressure caused by the inert gas introduced into the storage bottle 910, the liquid R in the storage bottle 910 moves to the trap tank 920 through the adapter 950, the valve 939, and the first pipe 930.

The trap tank 920 temporarily stores a liquid. The trap tank 930 receives the liquid supplied from the storage bottle 10 and accommodates the received liquid. The trap tank 930 removes bubbles in the liquid. The trap tank 920 may remove relatively large bubbles, but cannot remove micro bubbles. The trap tank 920 and the nozzle 892 are connected through a supply line L2. Although not illustrated, a supply pump may be provided on the supply line L2.

There may be a plurality of storage bottles 10 connected to the trap tank 920. The valves 939 are provided in a number corresponding to the plurality of storage bottles 10. The storage bottle 10 for transferring the liquid to the trap tank 920 is selected according to the opening and closing of the valve 939.

Figure 11:
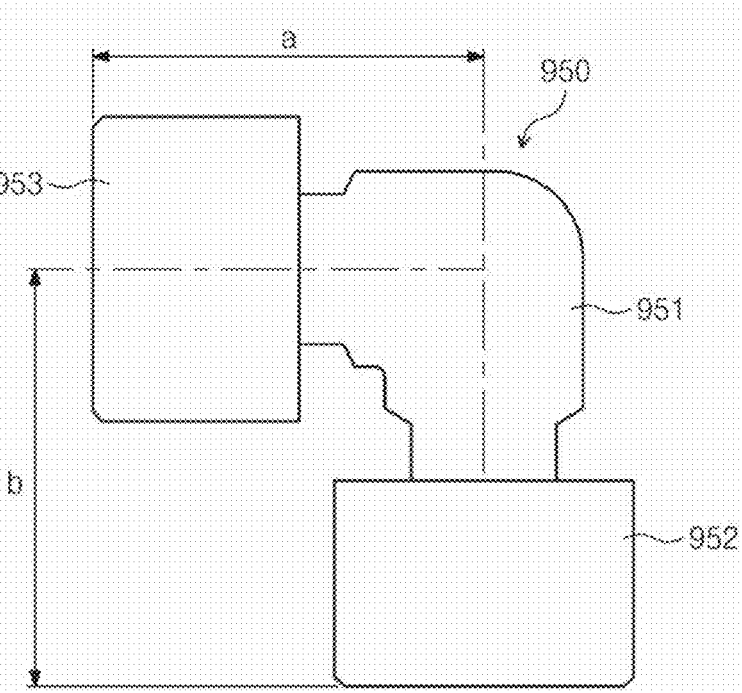
FIG. 11 is a side view of an adapter according to the first exemplary embodiment of the present invention.

Each of the storage bottles 10 and the trap tank 920 are connected through a pipe in which the adapter 950, the valve 939, and the first pipe 930 are sequentially connected. FIG. 11 is a side view of an adapter according to the first exemplary embodiment of the present invention. The adapter 950 is provided as an elbow adapter. The adapter 950 includes a pipe part 951, a bottle-side connection part 952, and a valve-side connection part 953. The length (a+b) of the flow path through which the liquid formed by the pipe part 951 is transmitted may be 20 cm or less. It is preferably as short as the configuration of the device allows. By applying the adapter 950, the container cap 11 and the valve 939 may be connected with the shortest distance.

Reference is again made to FIG. 10. The valve 939 is coupled to the valve-side connection part 953 of the adapter 950. The valve 939 opens and closes the flow path of the pipe. The first pipe 930 is coupled to the secondary side (downstream) of the valve 939. The first pipe 930 may be applied as a coil pipe. The length of the flow path formed by the first pipe 930 is longer than the length of the flow path formed by the adapter 950. The first pipe 930 is provided with a length sufficient to connect the location where the storage bottle 10 is provided to the location where the trap tank 920 is provided. The length of the flow path formed by the first pipe 930 may be about 1500 mm. The material of the first pipe 930 may be hydrophobic. The material of the first pipe 930 may be PFA. The trap tank 920 may be positioned at the same height as the bottom of the storage bottle 10 or higher than the bottom of the storage bottle 10. When the valve 939 is installed at the rear end of the adapter 950 and upstream the first pipe 930, the occurrence of backflow may be minimized.

Figure 12:
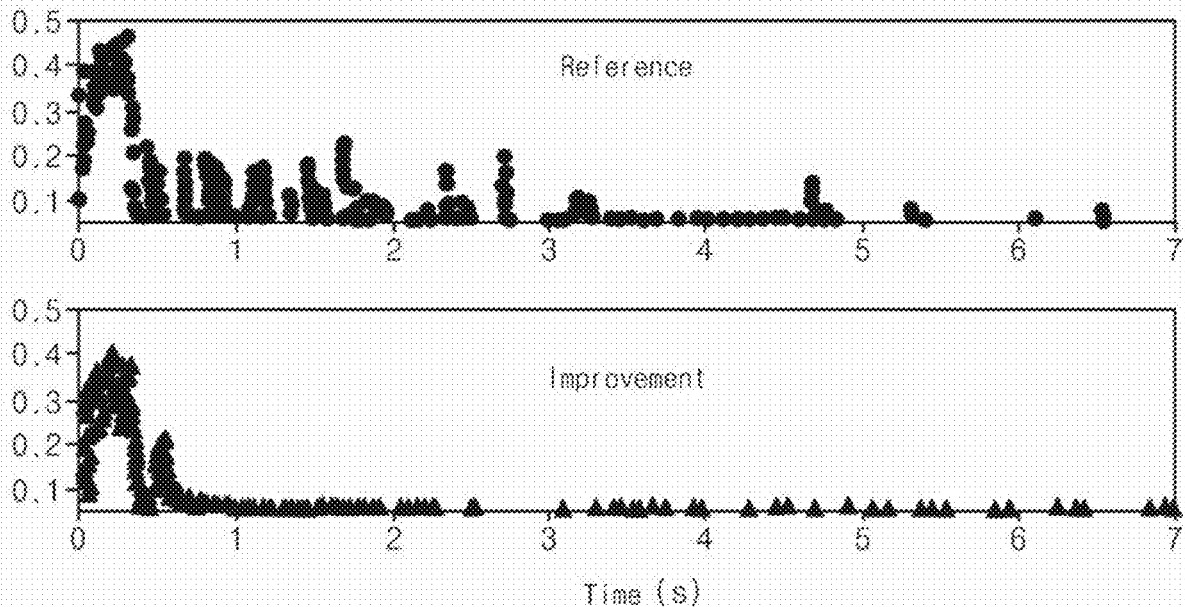
FIG. 12 is a graph of the amount of bubbles generated by time generated in the liquid supplying apparatus according to the first exemplary embodiment of the present invention, and a graph of the amount of bubbles generated by time according to a comparative example.
Figure 13:
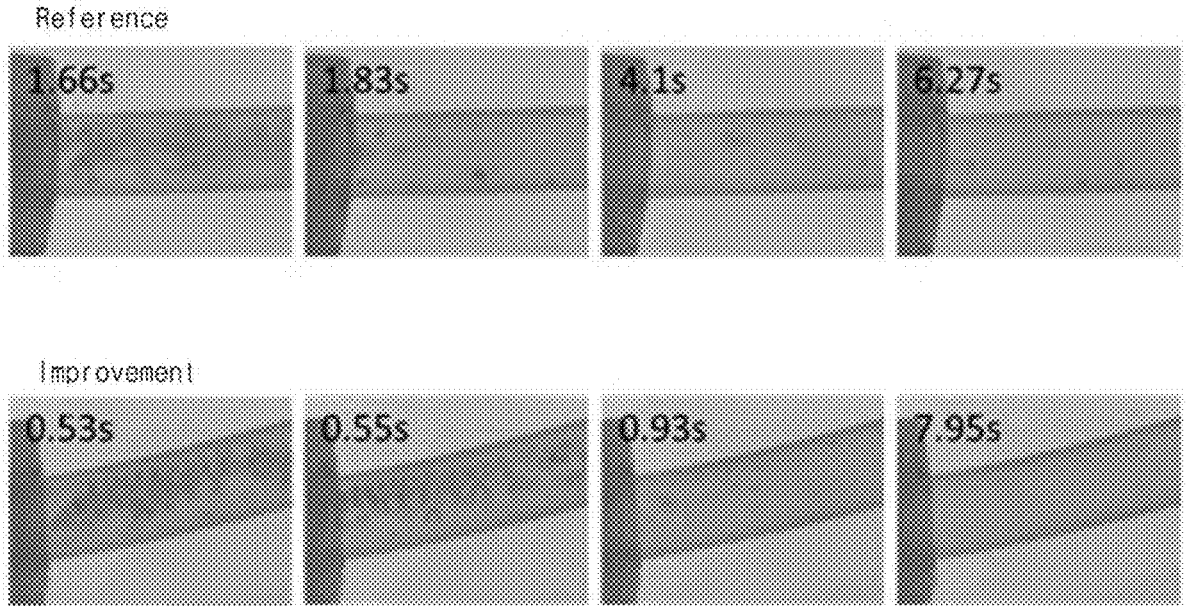
FIG. 13 is a picture of bubbles generated in the pipe of the liquid supplying apparatus by time according to the first exemplary embodiment of the present invention, and a picture of bubbles generated in the pipe by time according to the comparative example.

FIG. 12 is a graph of the amount of bubbles generated by time generated in the liquid supplying apparatus according to the first exemplary embodiment of the present invention, and a graph of the amount of bubbles generated by time according to a comparative example. FIG. 13 is a picture of bubbles generated in the pipe of the liquid supplying apparatus by time according to the first exemplary embodiment of the present invention, and a picture of bubbles generated in the pipe by time according to the comparative example. The first exemplary embodiment is the exemplary embodiment described above with reference to FIGS. 10 to 11, and the comparative example is the related art described with reference to FIG. 1. According to the experimental results, there is no significant difference in the bubbles generated up to the initial 0.5 seconds, but the decreasing trend is evident after about 1 second.

Figure 14:
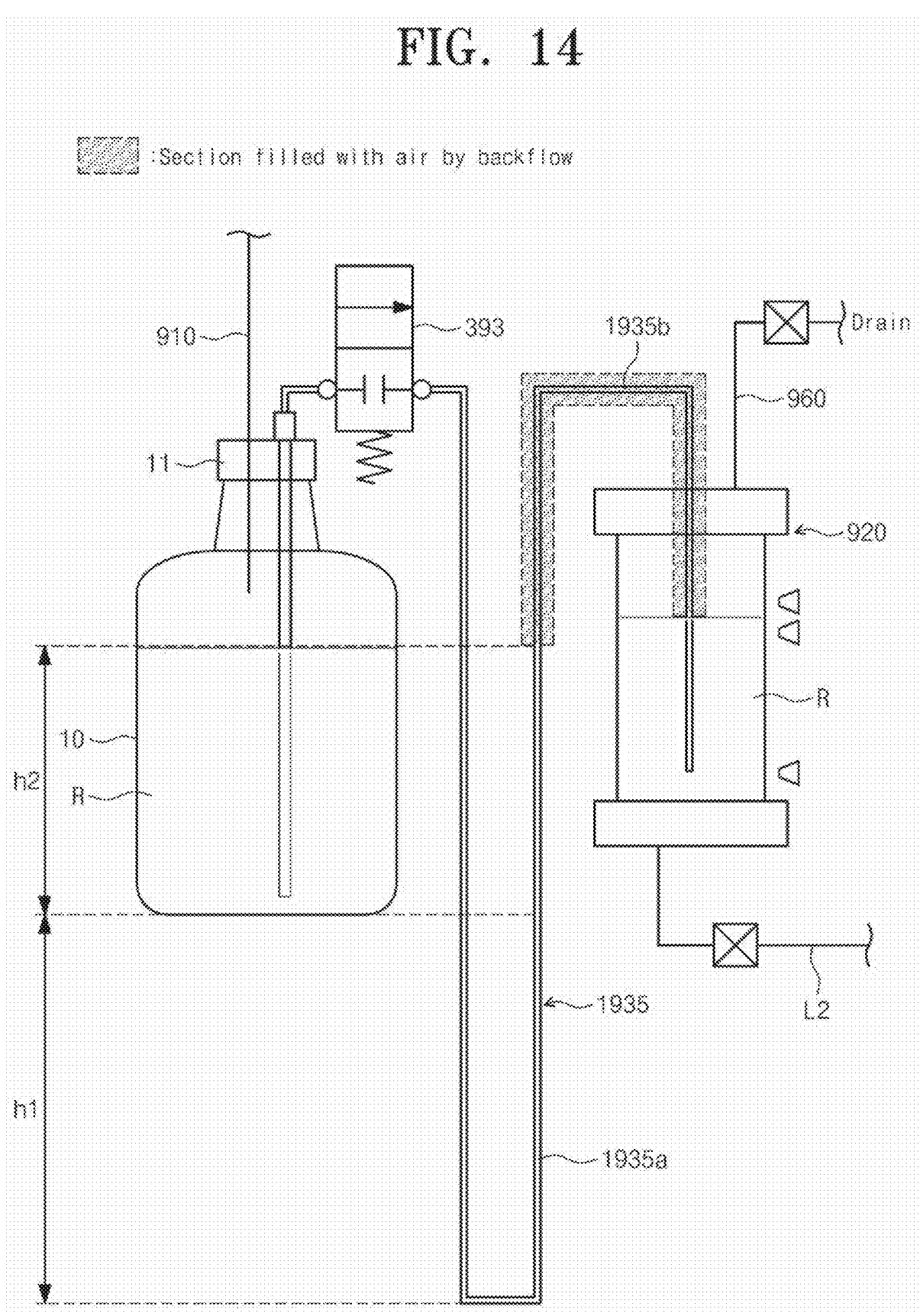
FIG. 14 is a diagram illustrating a liquid supplying apparatus according to a second exemplary embodiment of the present invention.

FIG. 14 is a diagram illustrating a liquid supplying apparatus according to a second exemplary embodiment of the present invention. In the description of the second exemplary embodiment, the same components as those described in the first exemplary embodiment use the same reference numerals and are replaced with the description of the first exemplary embodiment. The first pipe 1930 connects the valve 393 and the trap tank 920. The first pipe 1930 may be made of a hydrophobic material. A partial section of the first pipe 1930 is provided lower than the bottom of the storage bottle 10. Although the first pipe 1930 is illustrated as a straight pipe, it may be a coiled pipe. When the position of the partial section of the first pipe 1930 is provided low, since the liquid is always filled hydrodynamically in the first pipe 1930 to the height h1 where the liquid R of the storage bottle 10 is filled, it is possible to minimize the section in which the backflow may occur.

The lowest position in the first pipe 1930 may be set lower than the bottom surface of the storage bottle 10 by h1. h1 may be 50 mm or more.

Figure 15:
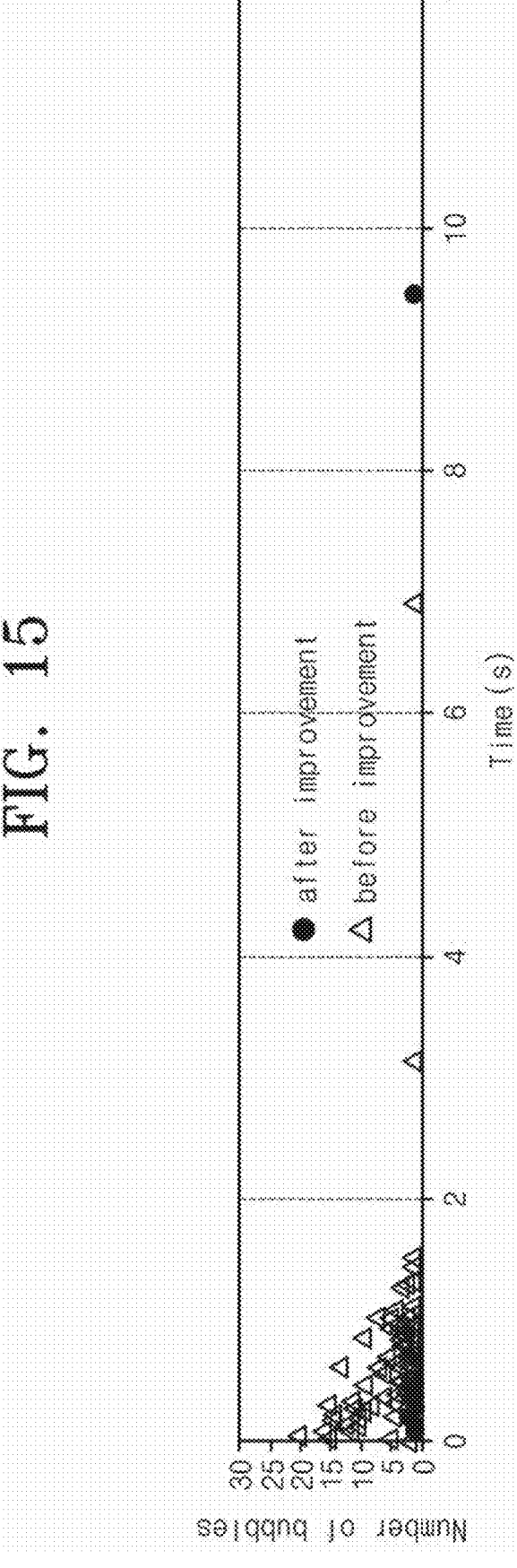
FIG. 15 is a graph illustrating the amount of bubbles generated in the pipe by time according to the comparative example (before improvement) and the amount of bubbles by time according to the exemplary embodiment of the present invention (after improvement).

FIG. 15 is a graph illustrating the amount of bubbles generated in the pipe by time according to the comparative example (before improvement) and the amount of bubbles by time according to the exemplary embodiment of the present invention (after improvement). When the height of the partial section of the first pipe 1930 is set lower than the bottom surface of the storage bottle 10, as illustrated in FIG. 15, a bubble reduction effect may be expected.

The foregoing exemplary embodiments are presented for helping the understanding of the present invention, and do not limit the scope of the present invention, and it should be understood that various modified exemplary embodiments from the foregoing exemplary embodiments are also included in the scope of the present invention. The technical protection scope of the present invention should be determined by the technical idea of the claims, and it should be understood that the technical protection scope of the present invention is not limited to the literal description of the claims itself, but substantially extends to the invention having the equivalent technical value.

What is claimed is:

1. A liquid supplying apparatus, comprising:
a trap tank configured to receive a liquid from a storage bottle in which the liquid is stored, the trap tank configured to accommodate the received liquid;
a pipe connecting the storage bottle and an upper portion of the trap tank; and
a valve on the pipe and configured to open and close a flow path of the pipe,
wherein the valve is closer to the storage bottle than the trap tank,
wherein the pipe includes:
a first pipe connecting the valve and the trap tank; and
an adapter directly connecting the storage bottle and the valve, wherein the adapter is L-shaped,
wherein the valve is above the storage bottle,
wherein the valve is upstream from the first pipe and one end of the adapter is directly connected to the valve,
wherein the first pipe has a partial section located lower than the storage bottle and the trap tank, and
wherein the first pipe has another section, continuous with and upstream from the partial section, an end of the another section above the storage bottle and the trap tank.

2. The liquid supplying apparatus of claim 1, wherein the first pipe is a coiled pipe.

3. The liquid supplying apparatus of claim 1, wherein a length of the flow path formed by the adapter is 20 cm or less.

4. The liquid supplying apparatus of claim 1, further comprising:
a second pipe connecting the storage bottle and the valve, wherein the second pipe has a length of 20 cm or less.

5. The liquid supplying apparatus of claim 1, wherein the storage bottle is connected to a pressurizing pipe supplying inert gas, and
the inert gas pressurizes the liquid.

6. The liquid supplying apparatus of claim 5, wherein the pipe is hydrophobic.

7. The liquid supplying apparatus of claim 1, wherein the trap tank is provided at a same position as a bottom surface of the storage bottle or at a position higher than the bottom surface of the storage bottle.

8. A substrate treating apparatus, comprising:
a support unit configured to maintain a substrate horizontally;
a nozzle configured to supply a liquid to the substrate; and
a liquid supplying apparatus configured to supply the liquid to the nozzle,
wherein the liquid supplying apparatus includes:
a trap tank configured to receive the liquid from a storage bottle in which the liquid is stored and configured to accommodate the received liquid;
a pipe connecting the storage bottle and an upper portion of the trap tank; and
a valve on the pipe and configured to open and close a flow path of the pipe, and
the valve is closer to the storage bottle than the trap tank,
wherein the pipe includes:
a first pipe connecting the valve and the trap tank; and
an adapter directly connecting the storage bottle and the valve, wherein the adapter is L-shaped,
wherein the valve is above the storage bottle,
wherein the valve is upstream from the first pipe and one end of the adapter is directly connected to the valve,
wherein the first pipe has a partial section located lower than the storage bottle and the trap tank, and wherein the first pipe has another section, continuous with and upstream from the partial section, an end of the another section above the storage bottle and the trap tank.

9. The substrate treating apparatus of claim 8, wherein the first pipe is coiled pipe.

10. The substrate treating apparatus of claim 8, wherein a length of the flow path formed by the adapter is 20 cm or less.

11. The substrate treating apparatus of claim 8, further comprising:
a second pipe connecting the storage bottle and the valve, wherein the second pipe has a length of 20 cm or less.

12. The substrate treating apparatus of claim 8, wherein the storage bottle is connected to a pressurizing pipe supplying inert gas, and
the inert gas pressurizes the liquid.

13. The substrate treating apparatus of claim 8, wherein the liquid is a photosensitive liquid.

14. A substrate treating apparatus, comprising:
a support unit configured to maintain a substrate horizontally;
a nozzle configured to supply a liquid to the substrate; and
a liquid supplying apparatus configured to supply the liquid to the nozzle,
wherein the liquid supplying apparatus includes:
a trap tank configured to accommodate the liquid;
a first pipe connecting a first storage bottle and the trap tank;
a second pipe connecting a second storage bottle and the trap tank;
a first valve on the first pipe and configured to open and close a flow path of the first pipe; and
a second valve on the second pipe and configured to open and close a flow path of the second pipe, and
wherein the first pipe includes:
a first coiled pipe connecting the first valve and an upper portion of the trap tank; and
a first adapter directly connecting the first storage bottle and the first valve,
wherein the first adapter is L-shaped,
wherein the first valve is above the first storage bottle,
wherein the first valve is upstream the first pipe and one end of the first adapter is directly connected to the first valve,
wherein the second pipe includes:
a second coiled pipe connecting the second valve and the trap tank; and
an second adapter connecting the second storage bottle and the second valve, wherein
the second adapter is L-shaped,
the second valve is above the second storage bottle,
wherein the second valve is upstream the second pipe and one end of the second adapter is directly connected to the second valve,
wherein a length of the flow path formed by each of the first adapter and the second adapter is 20 cm or less,
each of the first coiled pipe and the second coiled pipe has a partial section located lower than the trap tank and a respective one of the first storage bottle or the second storage bottle, and
the first coiled pipe has another section, continuous with and upstream from the partial section, an end of the another section above the first storage bottle.

* * * * *